(12) United States Patent
Liang et al.

(10) Patent No.: US 7,911,792 B2
(45) Date of Patent: Mar. 22, 2011

(54) DIRECT DIPPING COOLED POWER MODULE AND PACKAGING

(75) Inventors: Zhenxian Liang, Canton, MI (US); Chingchi Chen, Ann Arbor, MI (US); Michael W. Degner, Novi, MI (US)

(73) Assignee: Ford Global Technologies LLC, Dearborn, MI (US)

( * ) Notice: Subject to any disclaimer, the term of this patent is extended or adjusted under 35 U.S.C. 154(b) by 0 days.

(21) Appl. No.: 12/045,860

(22) Filed: Mar. 11, 2008

(65) Prior Publication Data

US 2009/0231810 A1     Sep. 17, 2009

(51) Int. Cl.
*H05K 7/20* (2006.01)
*H01L 23/36* (2006.01)

(52) U.S. Cl. ............... 361/699; 361/679.53; 361/698; 361/707; 361/708; 257/686; 257/714; 165/80.4; 165/80.5; 165/104.19

(58) Field of Classification Search ........... 361/699, 361/700, 702–712, 715–721, 729, 736, 790–794, 361/783, 679.46, 679.53; 165/80.3, 80.4, 165/104.33, 185; 257/713, 714, 685, 719; 62/259.2; 174/59, 60, 252, 16.3
See application file for complete search history.

(56) References Cited

U.S. PATENT DOCUMENTS

| | | | | |
|---|---|---|---|---|
| 4,712,160 A * | 12/1987 | Sato et al. | ............ | 361/710 |
| 4,716,498 A * | 12/1987 | Ellis | ............ | 361/715 |
| 4,878,106 A * | 10/1989 | Sachs | ............ | 257/796 |
| 5,040,994 A * | 8/1991 | Nakamoto et al. | ...... | 439/76.1 |
| 5,134,546 A * | 7/1992 | Izumi et al. | ........... | 361/736 |
| 5,245,508 A | 9/1993 | Mizzi | | |
| 5,262,921 A | 11/1993 | Lamers | | |
| 5,274,530 A | 12/1993 | Anderson | | |
| 5,657,203 A * | 8/1997 | Hirao et al. | ............ | 361/707 |
| 6,208,511 B1 * | 3/2001 | Bortolini et al. | ........ | 361/698 |
| 6,304,447 B1 * | 10/2001 | Bortolini et al. | ........ | 361/699 |
| 6,400,012 B1 | 6/2002 | Miller et al. | | |
| 6,644,645 B2 * | 11/2003 | Bakodledis | ............. | 271/3.17 |
| 6,697,257 B1 * | 2/2004 | Wolf et al. | ............... | 361/708 |
| 6,924,985 B2 * | 8/2005 | Kawakita et al. | ......... | 361/715 |
| 6,938,678 B1 * | 9/2005 | Bortolini et al. | ......... | 165/80.4 |
| 6,984,771 B2 * | 1/2006 | Roberds et al. | ............ | 800/3 |
| 7,190,581 B1 | 3/2007 | Hassani et al. | | |
| 7,208,829 B2 * | 4/2007 | Hauenstein et al. | ...... | 257/690 |
| 7,456,492 B2 * | 11/2008 | Mochida | ............. | 257/659 |
| 7,466,020 B2 * | 12/2008 | Eckardt et al. | ........... | 257/686 |
| 7,492,594 B2 * | 2/2009 | Pal | .................... | 361/699 |
| 7,508,668 B2 * | 3/2009 | Harada et al. | ............ | 361/699 |
| 7,619,302 B2 * | 11/2009 | Hauenstein | ............. | 257/666 |
| 7,656,016 B2 * | 2/2010 | Yoshimatsu et al. | ....... | 257/686 |
| 2007/0028955 A1 * | 2/2007 | Sogou et al. | ............. | 136/200 |
| 2007/0290311 A1 * | 12/2007 | Hauenstein | .............. | 257/685 |

* cited by examiner

*Primary Examiner* — Michael V Datskovskiy
(74) *Attorney, Agent, or Firm* — David Kelley, Esq.; Tung & Associates

(57) ABSTRACT

A power module package including a fully enclosed package comprising sidewalls; wherein at least one of said sidewalls includes a conductive substrate; wherein circuit elements are mounted on said conductive substrate on a first side comprising an inner side of said enclosed package; and, wherein a majority area of a second side of said conductive substrate is exposed, the power package has an improved interconnection configuration and compact power I/O terminals, offering low electrical parasitics, a plurality of individual power module packages can be attached seamlessly and positioned in a liquid coolant with multiple top portion open channels, as well as attached to a laminar power connector (busbar) to form various electrical power conversion topologies, the module offers low thermal resistance and low electrical parasitics, in addition to small volume, light weight and high reliability.

16 Claims, 4 Drawing Sheets

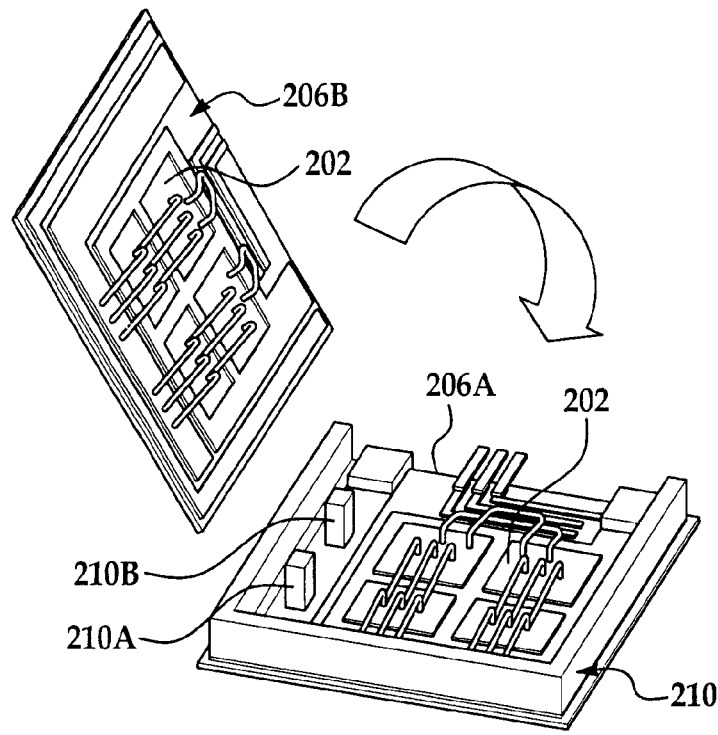
FIG. 2C
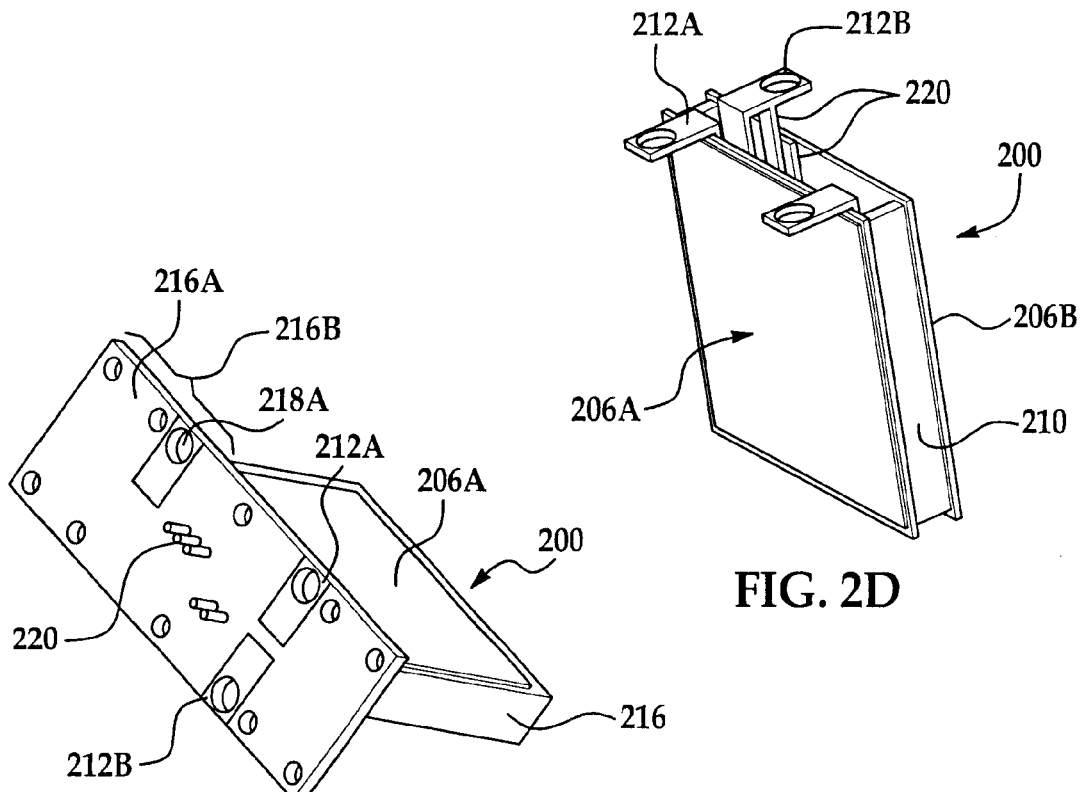
FIG. 2D
FIG. 2E

DIRECT DIPPING COOLED POWER MODULE AND PACKAGING

FIELD OF THE INVENTION

This invention generally relates to power modules including power semiconductor devices such as insulated gate bipolar transistors (IGBTs), power metal oxide semiconductor field effect transistors (MOSFETs), and diodes which function as electric power switching devices, and more particularly provides a novel power module package and power module package assembly to provide enhanced cooling and power dissipation while avoiding parasitic effects.

BACKGROUND OF THE INVENTION

Power semiconductor devices IGBTs, MOSFETs and diodes play the role of switching electric power at speeds of hundreds of kHz in power electronic conversion systems such as motor drives. The core element of these power switches is one or more semiconductor die (note the term die is used in both the singular and plural sense) each with a dimension of, for example 10 mm×10 mm×0.1 mm with rated current/voltage at hundreds of amperes (A) and hundreds of volts (V).

To facilitate high power conversion circuit configurations such as half- or full-bridge, three-phase, matrix, etc., power modules are built up by interconnecting multiple die and then encapsulating them into one housing or package. These processes are typically referred to as power module packaging. During operation, the die dissipate large amounts of heat, on the order of hundreds watts (W) per die, leading to high operating temperatures.

Semiconductor devices and associated packaging materials present inherent temperature limitations. For example, the maximum operating temperature of a silicon (Si) device is about 150° C. Furthermore, high temperature and large temperature excursion during their operation seriously affect the lifetime and/or reliability of power modules. Consequently, cooling design strategies including strict requirements for a power module's thermal performance are necessary to control device (die) temperatures. In addition, another main function of a power module structure is to supply mechanical support in harsh environments including high stress environments including high stress vibration conditions.

The characterization of power module performance includes characterization of specific operating parameters, for example, thermal resistance, parasitic inductance, power density, and number to failure, etch, all of which are related to the physical structure and material properties of the power module package.

For example, a conventional wire-bonded power module package in the prior art, as shown in FIG. 1A, employs bonding wire and solder to respectively connect the electrodes on the top and bottom of the die, e.g., 14, onto the etched circuit in a direct bond copper (DBC) substrate, e.g., including a ceramic plate 12B sandwiched between double side Cu layers 12A and 12C. The power and signal input/output (I/O) is carried out by soldering Cu terminals (e.g., 16A and 16C) on the DBC substrate. This assembly is then soldered onto a flat Cu baseplate 12 and encapsulated in a plastic housing (e.g., 18) filled with a polymer protective (filling) to perform mechanical support and electrical isolation. The module with baseplate 12 is then bolted with bolts e.g., 24 onto a heatsink 22 with thermal paste (or grease) between the baseplate 12 and heatsink 22 to reduce the contact thermal resistance. A power busbar 26 is attached to power terminals on the housing (e.g., copper terminals 16A) as well as including signal terminals e.g., 16C for next level electrical connection.

It is known that the thermal resistivity (thermal resistance per unit area) includes thermal resistance from different layers in series with an original heat source (die) to the outside coolant in contact with the heatsink. The various layers include the top solder layer, DBC layers (Cu-Ceramic-Cu), bottom solder layer, baseplate, thermal paste and heat sink/cooler wall (half) to the coolant.

FIG. 1B shows the thermal resistivity of the various layers of the power module package where the thermal grease, solder, baseplate and heat sink wall contribute the greatest proportion to the total thermal resistance of the power module assembly.

There have been several approaches in the prior art to provide a low thermal resistance power module assembly in contact with a coolant. For example Hassani et al. disclose a power module where heat is dissipated through an abutting circuit substrate, which may be a direct bonded copper (DBC) substrate, to a spreader plate which includes a coolant passageway or opening that allows the coolant to directly contact the DBC substrate.

Mizzi (U.S. Pat. No. 5,245,508) discloses a cooling method for circuit boards where a plurality of heat conductive flexible membranes containing coolant fluids are compressed between adjacent circuit boards to conform to the surface of the individual circuit boards to dissipate heat.

Lamers (U.S. Pat. No. 5,262,921) discloses a method for cooling circuit boards where the non-circuit bearing side is exposed directly to a coolant stream.

Anderson (U.S. Pat. No. 5,274,530) discloses a module for cooling semiconductor die where two printed circuit wiring boards with a plurality of semiconductor die mounted thereon form two opposite inside surfaces of a module and are attached to outer cover plates. The module is received in a chassis with slots which are formed by the sidewalls in the chassis. Coolant passes between the sidewalls to remove heat from the module.

Miller et al. (U.S. Pat. No. 6,400,012) discloses a heat sink for cooling an integrated circuit where a semiconductor device is mechanically and electrically coupled to the top surface of a dielectric substrate having one or more wiring layers therein. A fluid flow channel defined in a back-side surface of the substrate for passing a cooling medium.

Prior art cooling methods and modules have several shortcomings. For example, due to complex cooling configuration, such prior art modules have serious limitations including undesirably high thermal resistance, poor thermo-mechanical reliability, undesirably high weight, and undesirably high cost of manufacture, as well as producing undesired electrical parasitic effects caused by lack of special electrical considerations.

Thus, there is a need for improved power module structures and packages in the power module packaging art to overcome problems in the prior art including providing for improved heat dissipation, reduced parasitic effects, reduced volume, reduced weight, and improved reliability in harsh environments, all of the foregoing achieved at a reduced cost.

Therefore it is an object of the invention to provide an improved power module structure and package to provide improved heat dissipation, reduced parasitic effects, reduced volume, reduced weight, and improved reliability in harsh environments, all of the foregoing achieved at a reduced cost.

SUMMARY OF THE INVENTION

According to one aspect of the invention, a power module, typically of a single power, half-bridge power conversion configuration, is formed in a hydraulically sealed package by circuit substrates with power semiconductor die mounted thereto and connected to interior conductive layers. The entire exterior surfaces of the circuit substrates are indirect contact with a coolant which enables the module is to have the smallest thermal resistance from die to coolant.

According to another aspect of the invention, an enclosed power module package is mounted and positioned in a liquid cooler with slot openings in the liquid cooler, and a forced coolant flow passes through the slot openings.

According to another aspect of the invention, a power module package is provided with improved electrical performance including, folded circuitry layout to cancel the parasitic effects, as well as the compact power terminals, to reduce the parasitic inductance inside and outside from module to power busbar.

According to another aspect of the invention, a power module assembly including a plurality of power module packages is provided where the power module assembly includes a power busbar connected to the individual power module packages at a top portion to enable flexible arrangement of the individual power module packages for immersion of sidewalls and a bottom portion of the power module packages into a receiving coolant containing cooler.

According to another aspect of the invention, a power module assembly including a plurality of power module packages is provided where the power module assembly includes a power busbar connected to the individual power module packages at a top portion to enable selectable operation of one or more of the individual power module packages in series and/or parallel achieve a desired power conversion topology.

According to another aspect of the invention, a power module assembly including a plurality of power module packages is provided where the power switching units can be replaced by disassemble the power module assembly due to individual power module interconnection.

These and other objects, aspects and features of the invention will be better understood from a detailed description of the preferred embodiments of the invention which are further described below in conjunction with the accompanying Figures.

BRIEF DESCRIPTION OF THE DRAWINGS

FIG. 2C shows a 3-D view of a partially assembled power module package according to an embodiment of the present invention.

FIG. 2D shows a 3-D view of a partially assembled power module package according to an embodiment of the present invention.

FIG. 2E shows a 3-D view of a fully enclosed power module package according to an embodiment of the present invention.

DETAILED DESCRIPTION OF THE PREFERRED EMBODIMENT

Figure 1A:
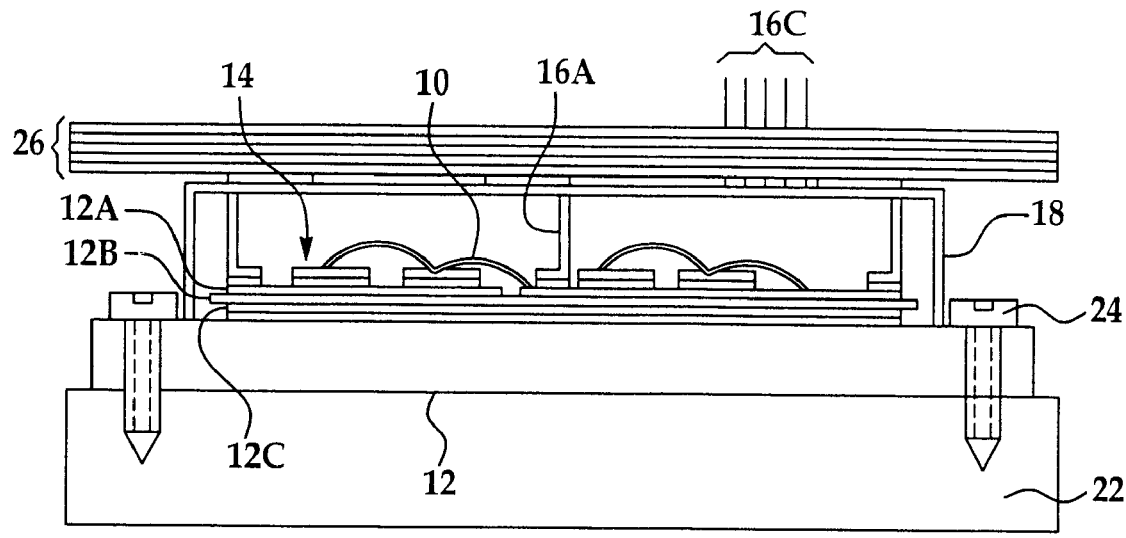
FIG. 1A is a prior art power module package.
Figure 1B:
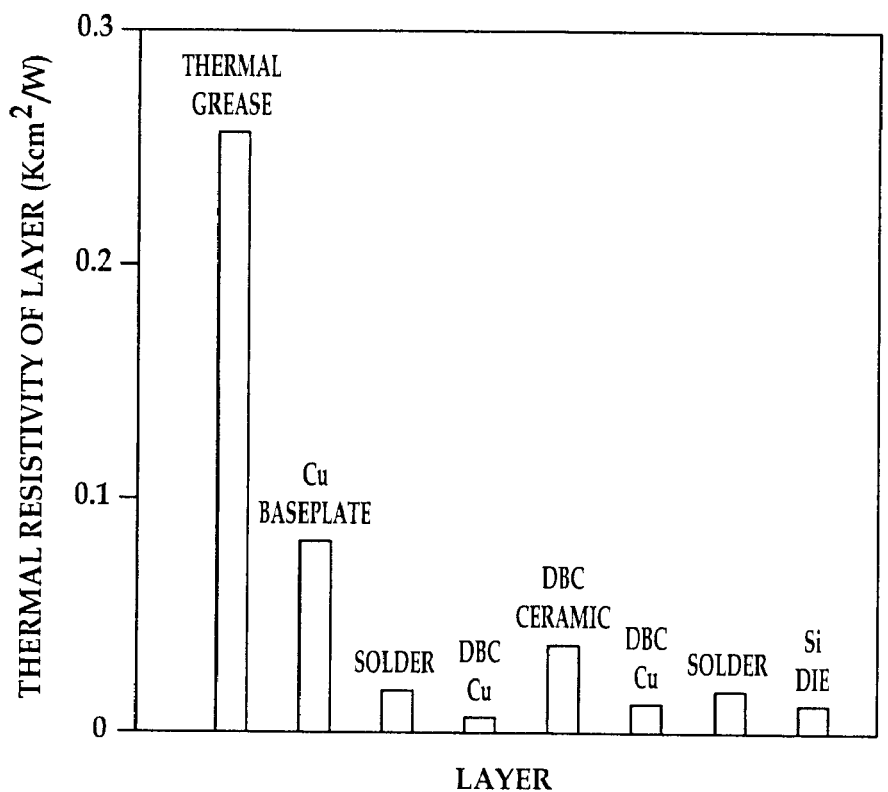
FIG. 1B shows the contributions to thermal resistivity of the prior art power module package in FIG. 1A.

The present invention achieves the foregoing objects, aspects and features by providing circuit elements, such as semiconductor die forming a portion of a power module package, mounted by direct bonding through a conductive layer to a conductive circuit substrate forming at least one sidewall of a fully enclosed power module package. The power module package includes at least one conductive circuit substrate with mounted circuit elements forming at least one sidewall of an enclosed and sealed power module package (container) where two sidewalls of the power module package have a greater width compared to two other sidewalls of the power module container to form a fin shaped structure, for example having a width greater by a factor of greater than 2, preferably greater than 3, even more preferably greater than 4.

The circuit elements directly bonded on the conductive circuit substrate forming a rectangular shaped sidewall of the power module package face inward to an enclosed space defined by the enclosed power module package, for example, facing an opposing sidewall of a rectangular shaped power module package. The remaining two sidewalls and bottom are relatively narrow and formed by a U-shaped frame soldered or bonded by glue to the conductive circuit substrates and then sealed from the outside with a moldable material to prevent coolant leakage into the power module package. The enclosed space of the power module package may be filled with an electrically insulating material, including for example, a curable polymer.

In one embodiment, the power module package includes at least two conductive circuit substrates (circuit boards) arranged such that the at least two conductive circuit substrates form at least two respective sidewalls of the enclosed space defined by the power module package where the upper surfaces of the circuit elements mounted on a first side of the conductive circuit substrates face inward to the enclosed space. The first sides of the at least two conductive substrates may be electrically connected together, for example by soldering conductive shims or spacers, such as aluminum or copper, extending between and connecting to the two conductive circuit boards.

The conductive circuit substrates with mounted circuit elements are further preferably attached (e.g., directly bonded through a first side of the respective conductive substrate) to a U-shaped frame at the periphery of the respective conductive circuit substrates (e.g., bottom and sides to exclude a top side) forming a bottom and two sidewalls of the power module package. The outer surfaces or second side of the conductive circuit substrates form a majority outer surface area of the power module package to enable direct contact by a coolant.

The power module package when assembled is at least sealed along joints connecting the conductive circuit substrate and the U-shaped frame portion to prevent leakage of coolant into the enclosed space. The U-shaped frame may be either a metal or an insulator material, but is preferably metal to enable soldering to the conductive circuit boards and to further enhance heat transfer from the conductive circuit boards.

In one embodiment, the power module package forms a rectangular shape, such as an elongated box shape or elongated fin shape e.g., the U-shaped frame forming sidewalls and bottom of the power module package having a smaller width than two sidewalls formed by the respective conductive circuit boards.

In one embodiment, the conductive circuit substrate includes a metal substrate such as aluminum or copper, and may be a direct bonded (DB) copper (DBC) substrate, for example a ceramic layer interposed between two copper layers. In addition, the direct bonded (DB) substrate may include a ceramic layer interposed between two aluminum layers or between an aluminum and copper layer.

The circuit elements, such as semiconductor die are mounted by direct bonding through an electrically conductive layer onto a first side of the conductive circuit substrate. The bonding may be accomplished by a conductive bonding material such as a metal or metal alloy material, including a solder material. The solder material may be any solder material, including Pb—Sn alloys. In one embodiment, a high temperature solder material is used to bond the semiconductor die to the conductive circuit substrate, for example, having a melting temperature greater than about 270° C. In other embodiments, other parts of the power module package, such as the U-shaped frame and electrically conductive shim portions extending between two facing sides of the conductive circuit substrates are attached with a low temperature solder material, for example having melting point less than 270° C., including less than 183° C.

The circuit elements bonded to the circuit substrates may include integrated circuit (IC) elements such as one or more semiconductor die. For example the IC elements may include Insulated-Gate Bipolar Transistors (IGBTs), power Metal-Oxide-Semiconductor-Field-Effect-Transistors (MOSFETS), and diodes. In one embodiment the circuit elements include a plurality of IGBTs and diodes. The circuit elements, such as a plurality of IGBTs and diodes may form a half bridge configuration within a power module container. Alternatively, other power conversion configurations may be used such as full-bridge, three-phase, matrix, and the like.

In another embodiment, a plurality of enclosed power module packages is provided as an assembly of power module packages which may be received by and attached to a cooler structure where the cooler structure may include channels for receiving the power modules and where coolant is provided in the channels to contact outer sidewall surfaces and bottoms of the respective power module packages. The individual power module packages may be connected together by a power busbar at terminals extending through a top portion of the power module packages outside of the cooler structure.

Referring to FIGS. 2A-2F are shown schematic views of an exemplary power module package and a power module package assembly according to embodiments of the present invention.

Figure 2A:
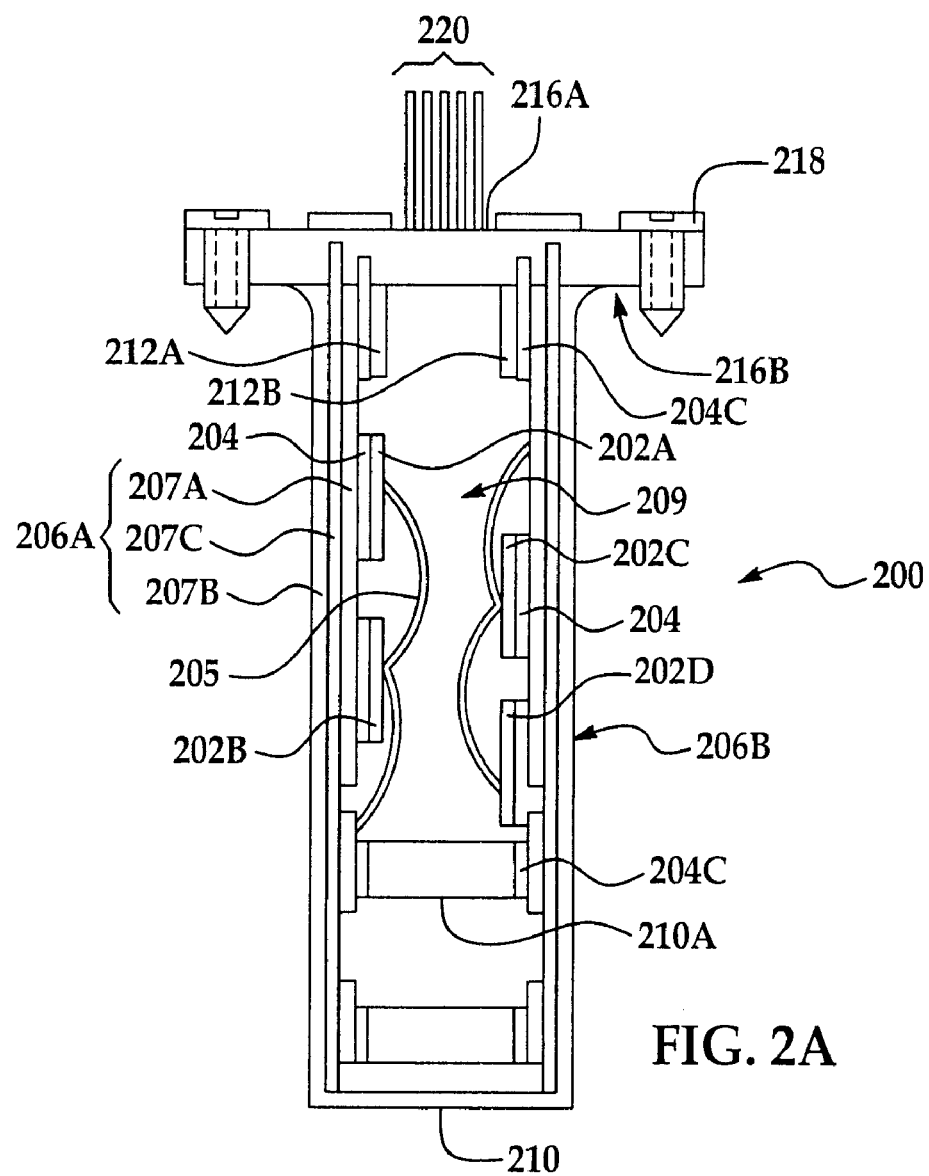
FIG. 2A shows a cross sectional side view of a power module package according to an embodiment of the present invention.

For example, in FIG. 2A is a cross section of power module package 200, showing two sidewalls formed by attached conductive circuit substrates with circuit elements arranged face-to-face, such as semiconductor die e.g., 202A, 202B, directly bonded through respective electrically conductive bonding layers e.g., 204, such as a metal alloy or solder, to an upper conductive layer (first side) of first conductive circuit substrate 206A. The first conductive circuit substrate 206A may be a direct bonded (DB) substrate, for example formed of copper and/or aluminum layers on either side of a middle ceramic layer, such as AlN or $Al_2O_3$.

Figure 2B:
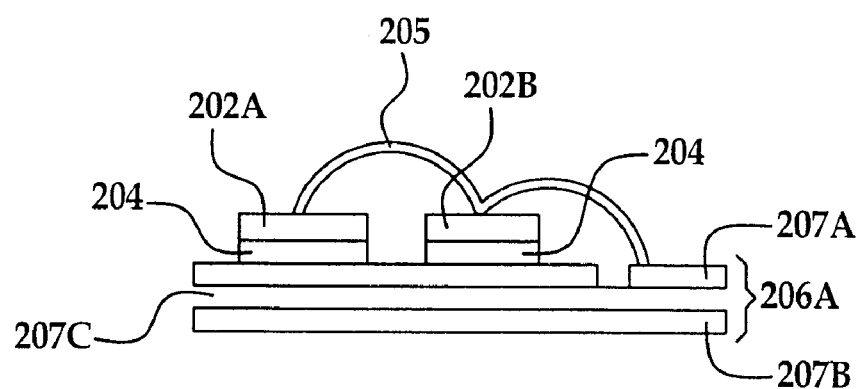
FIG. 2B shows an expanded view of a portion a power module package according to an embodiment of the present invention.

For example referring to FIG. 2B is shown an expanded side view of DB substrate 206A with semiconductor die 202A and 202B directly bonded to the upper metal layer 207A which is separated from lower metal layer 207B by an insulating layer such as a ceramic layer 207C, which may include ceramics such as AlN or $Al_2O_3$. Semiconductor die 202A and 202B, e.g., IGBT semiconductor die, are shown wire bonded with metal wiring 205, which may be Al, from e.g., an emitter electrode on IGBT element 202A to a collector electrode on IGBT element 202B to an adjacent trace portion of upper metal layer 207A (upper portion of metal layer removed to form conductive trace portions). The circuit elements may be bonded to the upper metal layer 207A through a high temperature solder layer 204, the melting temperature depending on the subsequent operating temperature of the power module package, for example, the melting point of the solder may be greater than about 270 degrees C. It will be appreciated that in other embodiments, the circuit elements such as 202A and 202B may be any power module circuit elements.

Referring back to FIG. 2A, it will be understood that the DB substrates 206A (including inner metal layer 207A, ceramic layer 207C and outer metal layer 207B) and 206B form two opposing respective sidewalls of the power module package and that spaces shown between portions of the upper metal layer 207A represent separated trace portions in the upper metal layer of the DB substrates.

Still referring to FIG. 2A, a second conductive substrate 206B, such as a second DB substrate with circuit elements bonded through a conductive bonding layer (e.g., 204) to an inward facing surface of the DB substrate (upper conductive layer), such as semiconductor die elements 202C, 202D, is formed in a similar manner to DB substrate 206A. The second conductive substrate 206B is arranged opposite and facing DBC substrate 206A, the two DBC substrates 206A and 206B forming two sidewalls of a rectangular shaped power module package.

Referring to FIG. 2C is shown a 3-D view of a partially assembled power module package (excluding a top portion) including each of the conductive substrates 206A and 206B with respective die e.g., 202, which may be each bonded through a conductive bonding layer, for example a metal alloy or solder, onto a respective conductive U-shaped frame 210, extending around the respective periphery excluding a top portion of the DB substrates 206A and 206B. The U-shaped frame 210 may be copper or aluminum and the solder may be a low temperature solder material, preferably lower than the solder used to bond the circuit elements, for example having a melting point less than about 183 C.

Conductive portions, such as one or more metal shims or spacers e.g., 210A and 210B, which may be copper or aluminum, are attached to the inner metal layer trace portions of the respective DB substrates to electrically connect the respective DB substrates 206A and 206B together. Preferably, the metal shims e.g., 210A and 210B are soldered directly to the respective DB substrates 206A and 206B on the first side (inward facing portion) through a conductive bonding material/layer e.g., 204C such as solder which may be a low temperature solder material, such as that used to attach the U-shaped frame 210.

Referring to FIG. 2D is shown a 3-D view of a partially assembled power module package (enclosed excluding a top portion) including each of the conductive substrates 206A and 206B attached to U-shaped frame 210 including conductive terminals, e.g., 212A, 212B and 220, such as metal straps which may be copper or another metal, directly bonded to the respective DB substrates 206A and 206B through a conductive layer such as solder e.g., 204C (FIG. 2A). The conductive terminals 212A, 212B, may be power I/O and 220 signal terminals, extending through the top to provide electrical connection such as power I/O or other signals to the DBC substrates (and/or circuit elements).

The partially enclosed power module package may then be filled though the open top with an electrically insulating material 209, such as a soft polymer, such as silicone gel or the like, which may then be cured to form a stiffer polymer for mechanical protection, electrical insulation and/or high thermal conduction of the circuit elements.

Referring to FIG. 2E is shown a 3-D view of a fully enclosed power module package where the top portion as well as the sidewalls of U-shaped frame 210 are sealably enclosed by attaching a moldable material 210C & 216, such as a plastic or polymer, over the U-shaped frame 210 and optionally over the edges of the DB substrates 206A and 206B to effectively seal out external coolant fluid. For example, the sidewalls and bottom of the U-shaped frame as well as the top portion including upper conductive terminals 212A, 212B, are attached to a top support 216A, which may be formed of the moldable material, and which may include a rim portion 216B extending past the width defined by two opposing conductive circuit substrate sidewalls of the power module package to provide an attachment rim area or lip area adjacent the top of the power module. The rim portion 216B may include bolt holes 218A for passing bolts e.g., 218 (FIG. 2A) on either side of the power module package 200 to attach to a cooler structure. In addition, the top support 216A may include electrical connection pins, e.g., 220 extending through the top support 216A.

In one embodiment, all the sealing parts, e.g., 210C 216, 216A & 216B, may be formed of a polymeric material in a single molding process.

In one embodiment, the circuit elements including semiconductor die, 202A and 202B, may be IGBT/diode pair forming a portion of a power conversion unit, known in the art as a half bridge. Another portion of the half bridge may include another IGBT/diode circuit elements such as semiconductor die 202C and 202D. For example, the IGBT and the diodes are wired in parallel with respect to each other and where respective IGBT/diode pairs are connected together and to a respective DBC substrate by wire bonded wiring (e.g., Al) 205 in series (e.g., a totem pole structure).

For example, an emitter and gate electrodes of an IGBT die (e.g., 202A, 202C), and an anode electrode of a diode die (e.g., 202B, 202D) are each connected to a Cu upper layer trace portion on respective DB copper substrates 206A and 206B by wire bonded wires (e.g., 205). In addition, the collector of an IGBT die (e.g., 202A, 202C) and cathode of a diode die (e.g., 202B and 202D) are each connected to a Cu trace portion on respective DB copper (DBC) substrates 206A and 206B by mounting (e.g., soldering) onto the respective DBC substrates.

Figure 2F:
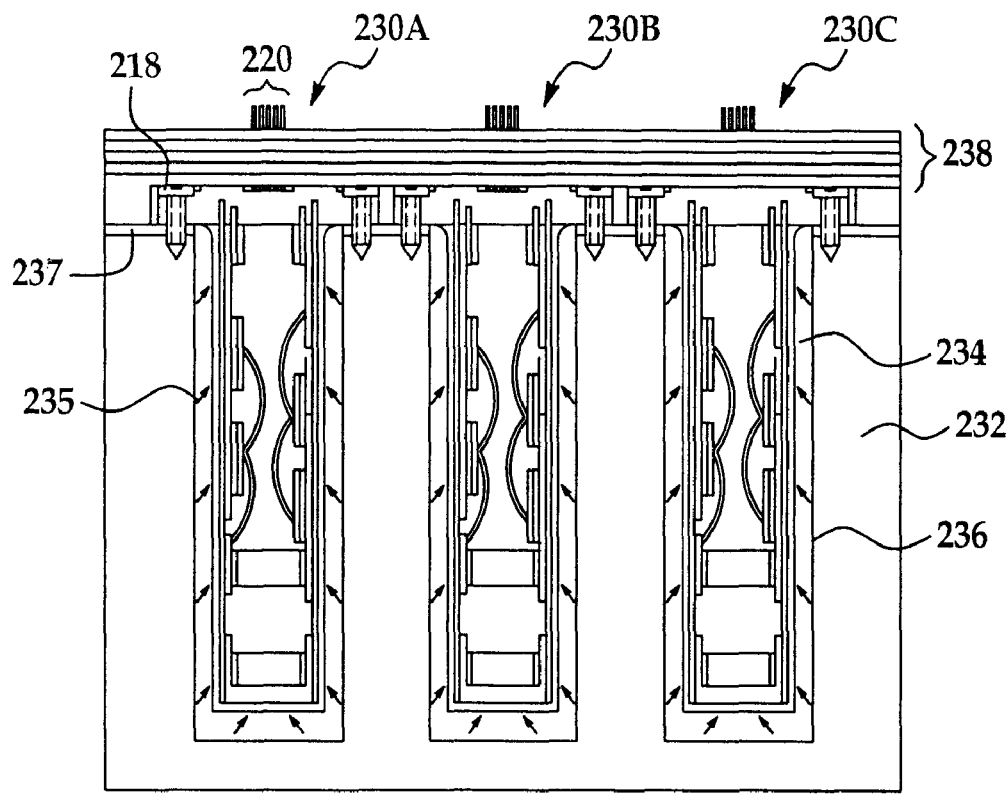
FIG. 2F shows a cross section of an assembly of a plurality of power module packages forming a power module package assembly arranged in a receiving cooler assembly according to an embodiment of the present invention.
Figure 3:
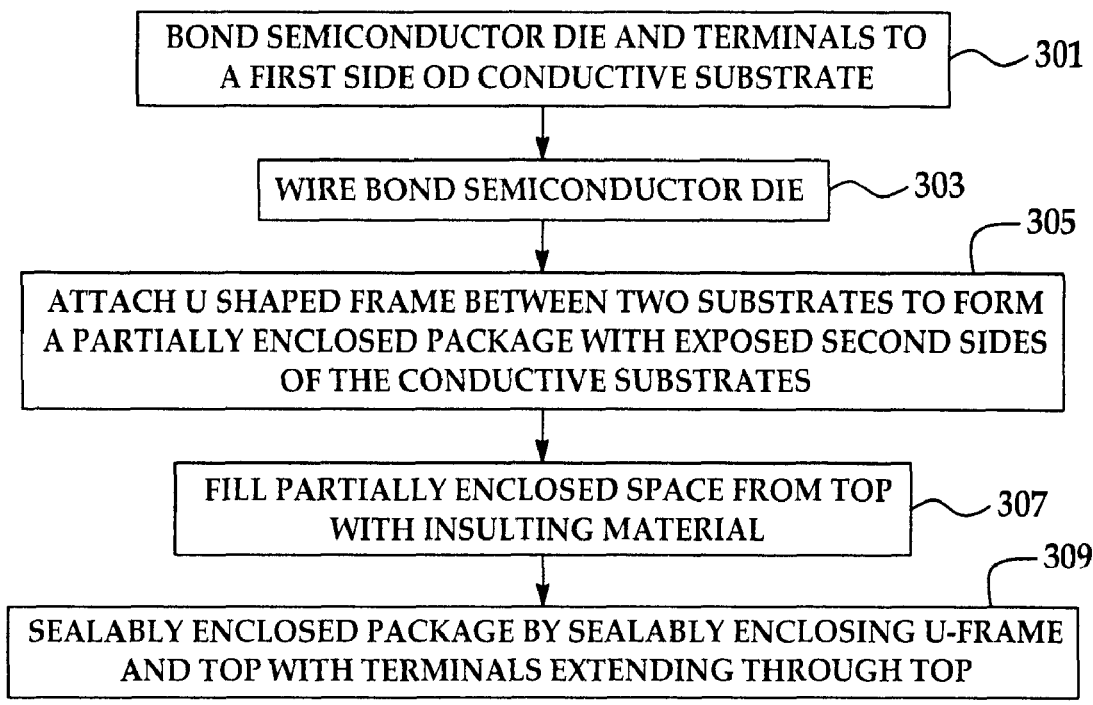
FIG. 3 shows exemplary process steps for forming a power module package according embodiments of the present invention.

Referring to FIG. 2F is shown a cross-sectional view of a plurality of individual fully enclosed and sealed power module packages e.g., 230A, 230B, and 230C, attached to a cooler container 232. The cooler structure may be a container containing coolant 234 arranged to contact the outer surfaces of the power modules such as the backside of the DBC substrates 206A and 206B. The cooler container may include a plurality of channels e.g., 236 sized for receiving each of the power module packages and providing a space adjacent to the sidewall surfaces and bottom of the power module packages for providing or passing a coolant. For example, the coolant may be provided by forced flow in the channels past the power module packages or the cooler container may include spray nozzles (not shown) arranged in the sidewalls of the channels 236 for spraying (indicated by arrows e.g., 235) the coolant onto the external surfaces (e.g., the exposed sidewall surfaces of the DBC substrates) of the power module packages.

The cooler container 232 may include resilient sealing material such as gaskets or O-rings 237 extending around upper attachment surfaces of the coolant container, such as extending around bolt holes for receiving bolts 218 to sealably attach the top support portions 216 of the power module packages to the upper attachment surfaces of the coolant container 232 (e.g., upper surfaces of coolant channel walls).

The plurality of individual enclosed and sealed power module containers e.g., 230A, 230B, and 230C, may be attached to a conductive busbar 238, which may be formed of one or more laminated conductive layers connecting (e.g., by screws) to external portions of the conductive terminals e.g., 212A, 212B. The busbar 238, e.g., providing I/O power may be configured to connect two or more of the power modules in series and/or in parallel to form a desired electrical power conversion topology.

In addition, the plurality of individual enclosed and sealed power module packages e.g., 230A, 230B, and 230C, including the busbar 238 may be formed into a single assembly for insertion into the coolant container 232. Thus, each individual power module package functions a self contained cooling fin with reduced thermal resistance, where coolant directly contacts the backside (outer facing sidewalls) of the DBC substrate without the presence of intervening thermally resistant layers or structures such as base plates, heat spreaders, or additional bonding layers.

In an exemplary process flow including embodiments of the invention for forming the individually enclosed power module packages, in step 301 one or more semiconductor die and conductive terminals are bonded to a first side (inner sidewall) of each of at least two conductive circuit substrates. In step 303 the semiconductor die are then wire-bonded to each other and onto trace portions of the respective conductive circuit substrates. In step 305, peripheral portions of the first sides of the conductive circuit substrates are each attached to a U-shaped frame extending around the periphery of the conductive substrates to exclude a top portion and are attached together to form sidewalls of a partially enclosed power module package/container. In step 307, the partially enclosed power module package is then filled with an electrically insulating material. In step 309, the power module package is fully enclosed and sealed by attaching a moldable sealing material over the U-frame sidewalls including forming a sealed top support structure with electrical connection terminals and/or pins sealably extending therethrough.

Thus a method and power module package has been presented that provides reduced thermal resistance to a coolant at a reduced weight and cost (e.g., elimination of baseplate and heat spreader) compared to prior art structures, where the power module package acts as a self contained cooling fin, whereby the coolant may directly contact externally exposed portions of the cooling fin by dipping (immersing sidewalls and bottom portion) or spraying the power module package with a coolant, thereby providing for improved coolant delivery and heat dissipation of a power module package. In addition, the power module package allows circuit elements (die) to be attached in good thermally conductive contact on the inner side of the fin sidewalls (by conductive layer bonding) of the power module package in a manner that can additionally reduce electrical parasitic effects, such as inductance.

By arranging the plurality of power module packages in a distributed assembly connected together by a power busbar at a top portion of the power module packages, the plurality of power module packages may be selectively operated in series and/or parallel to achieve a desired power conversion topology as well as controlling and distributing resulting stresses (thermal and physical) to the individual power modules.

Advantageously, the distributed power module assembly allows flexible construction of different power conversion topologies or/and easy replacement of individual power modules. In addition, the open structure of the cooler may be readily manufactured to receive the power module assembly and the cooling schemes can be flexibly chosen with ready modification (for example, forced convection cooling or spray cooling).

While the embodiments illustrated in the Figures and described above are presently preferred, it should be understood that these embodiments are offered by way of example only. The invention is not limited to a particular embodiment, but extends to various modifications, combinations, and permutations as will occur to the ordinarily skilled artisan that nevertheless fall within the scope of the appended claims.

What is claimed is:

1. A power module package comprising:
a fully enclosed package comprising sidewalls a top portion having a rim extending beyond said sidewalls, said rim adapted to attach said power module package to a coolant containing structure, said package sealed with respect to a coolant contacting at least said sidewalls and a bottom of said package;
wherein at least one of said sidewalls comprises an electrically and thermally conductive substrate, said substrate comprising a metal;
wherein circuit elements are mounted on said conductive substrate on a first side comprising an inner side of said enclosed package, a top side of said circuit elements not bonded to an opposing sidewall, said top side not having an overlying circuit element, said top side spaced from said opposing sidewall;
a U-shaped frame attached along a periphery of each of said conductive substrates such that said conductive substrates are arranged in a face-to-face relationship; and,
wherein an entire area of a second side of said conductive substrate is exposed.

2. The power module package of claim 1, wherein said conductive substrate sidewall has a length greater than a width of top and bottom ends of the enclosed package.

3. The power module package of claim 1, wherein at least two of said sidewalls comprise a respective conductive substrate having circuit elements mounted on said first side of each of said respective conductive substrates wherein said first sides are electrically connected together and are arranged opposite one another.

4. The power module package of claim 1, wherein said circuit elements are mounted to said conductive substrate by an electrically conductive layer comprising a metal.

5. The power module package of claim 1, wherein said enclosed package comprises a top portion having terminals extending through said top portion, said terminals electrically connected to said conductive substrate and/or said circuit elements.

6. The power module package of claim 1, wherein said coolant containing structure comprises channels wider than a narrow width defined by said opposing sidewalls, said channels adapted to receive said power module package and apply coolant to said sidewalls of said power module package.

7. The power module package of claim 1, wherein said conductive substrate comprises an electrically insulating layer between two metal layers.

8. The power module package of claim 1, wherein said circuit elements are selected from the group consisting of Insulated Gate Bipolar Transistors (IGBT's) and diodes.

9. The power module package of claim 1, wherein said circuit elements comprise a half bridge configuration.

10. The power module package of claim 1, wherein said power module package comprises an electrically insulating material filling said power module package.

11. The power module package of claim 1, further comprising a powerbus attached to a plurality of power module packages, said powerbus attached to each of said power module packages at terminals extending through a top portion of each of said power module packages to form an assembly of said power module packages.

12. The power module package of claim 11, wherein said powerbus is attached to said plurality power module packages such that each of said power module packages are electrically configurable in a manner selected from the group consisting of series and parallel.

13. A power module package comprising:
a fully enclosed package comprising sidewalls a top portion having a rim extending beyond said sidewalls, said rim adapted to attach said power module package to a coolant containing structure, said package sealed with respect to a coolant contacting at least said sidewalls and a bottom of said package;
wherein at least two of said sidewalls are arranged opposite one another and comprise respective electrically and thermally conductive substrates, each conductive substrate comprising an electrically insulating layer between two metal layers;
wherein circuit elements are attached to each of said conductive substrates on a first side comprising an inner side of said enclosed package wherein said two sidewalls are electrically connected together through said respective first sides, a top side of said circuit elements not bonded to said opposing conductive substrate, said top side not having an overlying circuit element, said top side spaced from said opposing conductive substrate;
a U-shaped frame attached along a periphery and bottom of each of said conductive substrates such that said conductive substrates are arranged in a face-to-face relationship; and,
wherein an entire area of a second side of each said conductive substrates is exposed.

14. A method of forming a power module package comprising:
forming a conductive substrate comprising a metal, said conductivity both electrical and thermal;
mounting circuit elements on said conductive substrate;
forming a fully enclosed package a top portion having a rim extendin be and said sidewalls said rim adapted to attach said power module package to a coolant containing structure comprising said conductive substrate as a sidewall of said enclosed package wherein said mounted circuit elements are on a first side of said conductive substrate comprising an inner side of said enclosed package, a top side of said circuit elements not bonded to an opposing sidewall, said top side not having an overlying circuit element, said top side spaced from said opposing sidewall, said package sealed with respect to a coolant contacting at least said sidewalls of said package;
wherein said fully enclosed package is formed by attaching a U-shaped frame along a periphery of said conductive substrate and connecting said U-shaped frame to an opposing sidewall; and,
wherein an entire area of a second side of said conductive substrate is exposed.

15. The method of claim 14, wherein said sidewall has a length greater than a width of top and bottom ends of the enclosed package.

16. The method of claim 14, wherein the step of forming a fully enclosed package comprises:

provshapeding an additional conductive substrate to form an opposing sidewall of said enclosed package wherein second circuit elements are mounted on said additional conductive substrate on a first side of said additional conductive substrate; and electrically connecting the conductive substrate to the additional conductive substrate;

wherein an entire area of a second side of said additional conductive substrate is exposed.

* * * * *